(12) United States Patent
Hirata

(10) Patent No.: US 7,385,318 B2
(45) Date of Patent: Jun. 10, 2008

(54) POSITIONING SYSTEM, MAGNETIC BEARING, AND METHOD OF CONTROLLING THE SAME

(75) Inventor: Yoshihiro Hirata, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 344 days.

(21) Appl. No.: 11/282,713

(22) Filed: Nov. 21, 2005

(65) Prior Publication Data

US 2006/0119190 A1 Jun. 8, 2006

(30) Foreign Application Priority Data

Nov. 22, 2004 (JP) ............................. 2004-337357

(51) Int. Cl.
*H02K 41/00* (2006.01)
(52) U.S. Cl. .................... 310/12; 310/68 B; 318/135
(58) Field of Classification Search ............ 310/12–14, 310/68 D, 179; 318/135; 355/53
See application file for complete search history.

(56) References Cited

U.S. PATENT DOCUMENTS

| | | | |
|---|---|---|---|
| 5,925,956 A * | 7/1999 | Ohzeki ...................... 310/90.5 |
| 6,184,596 B1 * | 2/2001 | Ohzeki ........................ 310/12 |
| 6,396,566 B2 * | 5/2002 | Ebinuma et al. .............. 355/53 |
| 6,731,372 B2 * | 5/2004 | Binnard et al. ................ 355/53 |
| 6,859,257 B2 | 2/2005 | Korenaga ..................... 355/53 |
| 6,872,958 B2 * | 3/2005 | Andeen et al. .......... 250/492.2 |
| 6,927,550 B2 * | 8/2005 | Tamisier et al. ............ 318/611 |
| 6,946,757 B2 | 9/2005 | Korenaga ..................... 310/12 |
| 2002/0127050 A1 * | 9/2002 | Andeen et al. ............. 403/220 |
| 2004/0114116 A1 | 6/2004 | Asano .......................... 355/53 |

FOREIGN PATENT DOCUMENTS

| | | |
|---|---|---|
| JP | 2003-218188 | 7/2003 |
| JP | 2004-030616 | 1/2004 |
| JP | 2004-172557 | 6/2004 |

* cited by examiner

*Primary Examiner*—Thanh Lam
(74) *Attorney, Agent, or Firm*—Fitzpatrick, Cella, Harper & Scinto

(57) ABSTRACT

A stage system and a control method therefor. In one aspect, the stage system includes a stage which is going to be positioned, a magnetic material member provided on the stage, electromagnets disposed at opposite sides of the magnetic material member, a detector for detecting an electrical current value of a coil, which is a component of the electromagnets, and a position detector for detecting a position of the stage. The center position of the magnetic material member between the electromagnets can be determined on the basis of a relation between the position of the stage and the electrical current value of the coil, as the magnetic material member is moved relative to the electromagnets.

8 Claims, 10 Drawing Sheets

INITIAL POSITION : X

INITIAL POSITION : X+α

INITIAL POSITION : X−α

POSITIONING SYSTEM, MAGNETIC BEARING, AND METHOD OF CONTROLLING THE SAME

This application claims priority from Japanese Patent Application No. 2004-337357, filed Nov. 22, 2004, which is hereby incorporated by reference.

FIELD OF THE INVENTION AND RELATED ART

This invention relates generally to a positioning system having a magnetic bearing and to a method of controlling the same. More particularly, the invention is directed to a positioning system suitably usable in a semiconductor exposure apparatus or an inspection apparatus, for example, for accurately positioning an exposure original, such as a mask or a reticle, an article to be exposed, such as a semiconductor wafer, or an article to be inspected, at a predetermined position.

Exposure apparatuses used in the manufacture of semiconductor devices include those called a stepper and those called a scanner. The stepper is an apparatus, which is arranged so that an image of a pattern of a reticle is projected onto a semiconductor wafer by a projection lens in a reduced scale, while the wafer, which is being placed on a stage system is moved stepwise, whereby the pattern image is photoprinted on different zones of a single wafer.

On the other hand, the scanner is an apparatus, which is arranged so that a wafer placed on a wafer stage and a reticle placed on a reticle stage are moved relative to a projection lens and, during the scan motion, slit-like exposure light is projected, by which a reticle pattern is projected onto a wafer. The stepper and the scanner will be the mainstream of exposure apparatuses, in the point of resolution and overlay precision.

In recent years, for further improvements in speed and precision of stages, stage systems having a rough-motion stage and a fine-motion stage are being used. In such stage systems, the rough-motion stage moves with a large stroke, while the fine-motion stage moves with a small stroke, as compared with the rough-motion stage.

Japanese Laid-Open Patent Application, Publication No. 2003-218188, proposes use of an electromagnetic coupling (joint) between a rough-motion stage and a fine-motion stage, for transferring a force between these stages. Japanese Laid-Open Patent Application, Publication No. 2004-030616, proposes measuring a gap between each electromagnet of an electromagnetic coupling and a magnetic material plate, by use of a gap sensor.

In the positioning system having an electromagnetic coupling such as described above, the clearance between each electromagnet of the electromagnetic coupling and the magnetic material plate may affect the performance of the positioning system. More specifically, if, for example, the magnetic material plate is not positioned exactly at the center between opposed electromagnets, but the plate is deviated toward one of them, electrical loads of a control unit, such as a driving voltage or a driving current for a driver, which is related to one electromagnet having a wider clearance, or an electrical power consumption thereof, for example, will become larger, and finally, the required specification will not be satisfied.

On the other hand, if a sensor for measuring the gap is used, as disclosed in Japanese Laid-Open Patent Application, Publication No. 2004-030616, it would result in increases of weight, size and cost. Also, there would be many restrictions in regard to the design.

The sensor may be omitted by a method in which a fine-motion stage (magnetic material plate) is brought into contact with each electromagnet, and the gap is measured on the basis of the movement distance. In this method, however, there is a possibility that the electromagnet and the fine-motion stage are worn away and, in a worst case, they are broken.

There is another problem that different machines may have different gaps due to the mounting precision for the magnetic material plate and the electromagnets. This means that, even if the rough-motion stage and the fine-motion stage are moved to their relative central positions on the basis of measurement of the stage position, the magnetic material plate may not always be positioned exactly at the center between the electromagnets.

SUMMARY OF THE INVENTION

It is accordingly an object of the present invention to provide a positioning system by which, regardless of differences of machines with respect to the gap between an electromagnet and a magnetic material plate, the magnetic material plate can be positioned accurately at the center between opposed electromagnets, such that increases in electrical loads in the control can be suppressed effectively.

It is another object of the present invention to provide a control method for such a positioning system, a magnetic bearing device, or a control method for such a magnetic bearing device.

It is a further object of the present invention to provide an exposure apparatus or a device manufacturing method, which is based on such a positioning system, or a control method therefor, as described above.

In accordance with an aspect of the present invention, to achieve at least one of these objects, there is provided a positioning system, comprising a stage which is going to be positioned, a magnetic material member provided on the stage, electromagnets disposed at opposite sides of the magnetic material member, a detector for detecting an electrical current value of a coil, which is a component of the electromagnets, and a position detector for detecting a position of the stage, wherein a center position of the magnetic material member between the electromagnets is determined on the basis of a relation between the position of the stage and the electrical current value of the coil as the magnetic material member is moved relative to the electromagnets.

In accordance with another aspect of the present invention, there is provided an apparatus, comprising a first member, a second member, a magnetic material member provided on the first member, electromagnets provided on the second member and being disposed at opposite sides of the magnetic material member, a detector for detecting an electrical current value of a coil, which is a component of the electromagnets, and a position detector for detecting a position of at least one of the first member and the second member, wherein a center position of the magnetic material member between the electromagnets is determined on the basis of a relation between the position detected by the position detector and the electrical current value of the coil as the magnetic material member is moved relative to the electromagnets.

In accordance with a further aspect of the present invention, there is provided a method of controlling an apparatus having a magnetic material member being provided on a first member, and electromagnets provided on a second member and being disposed at opposite sides of the magnetic material member, the method comprising the steps of changing a relative position of the first and second members, detecting the relative position of the first and second members, detecting an electrical current value of a coil, which is a component of the electromagnets, and determining a center position of the magnetic material member between the electromagnets, on the basis of a relation between the relative position and the electrical current value.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 5A-5C are schematic and plan views, respectively, of an electromagnetic coupling having a pair of opposed electromagnets, wherein FIG. 5A shows a state in which a fine-motion stage (electromagnet target) is placed at its initial position X, FIG. 5B shows a stage in which the fine-motion stage is moved from the initial position, along the X direction and by +α, and FIG. 5C shows a state in which the fine-motion stage is moved from the initial position, along the X direction and by −α.

DESCRIPTION OF THE PREFERRED EMBODIMENTS

Preferred embodiments of the present invention will now be described with reference to the attached drawings.

Embodiment 1

Figure 1:
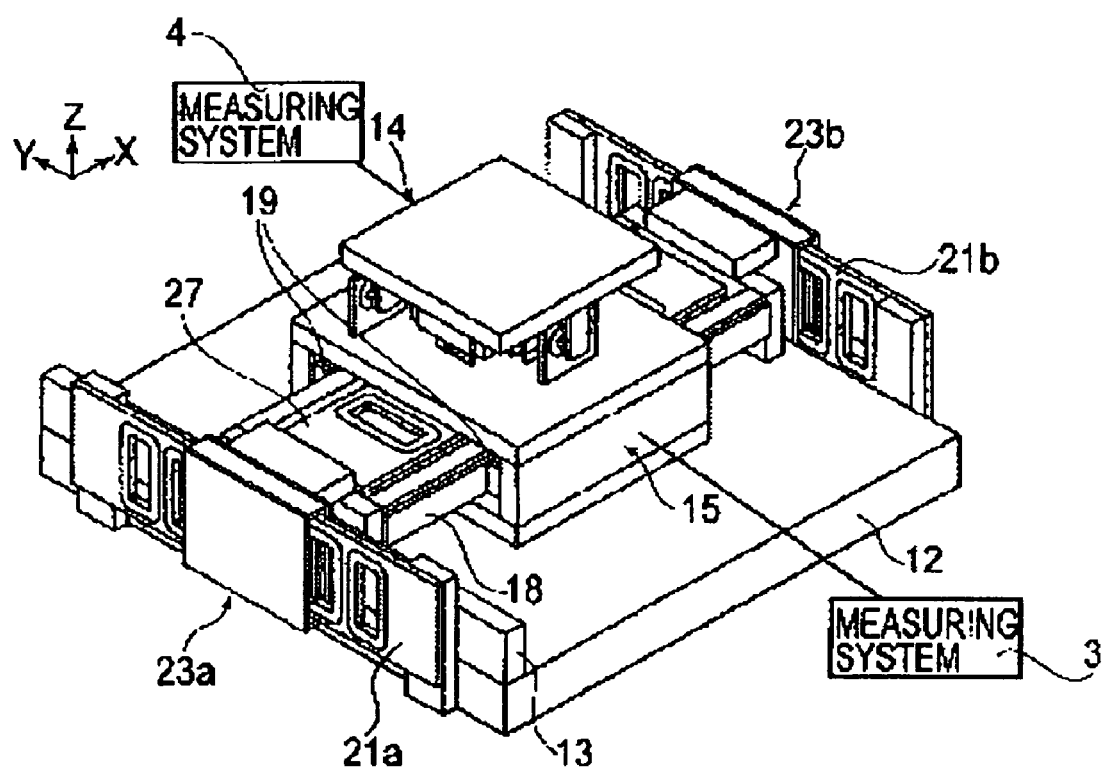
FIG. 1 is a perspective view of a stage system having a positioning and moving mechanism, according to an embodiment of the present invention.
Figure 2:
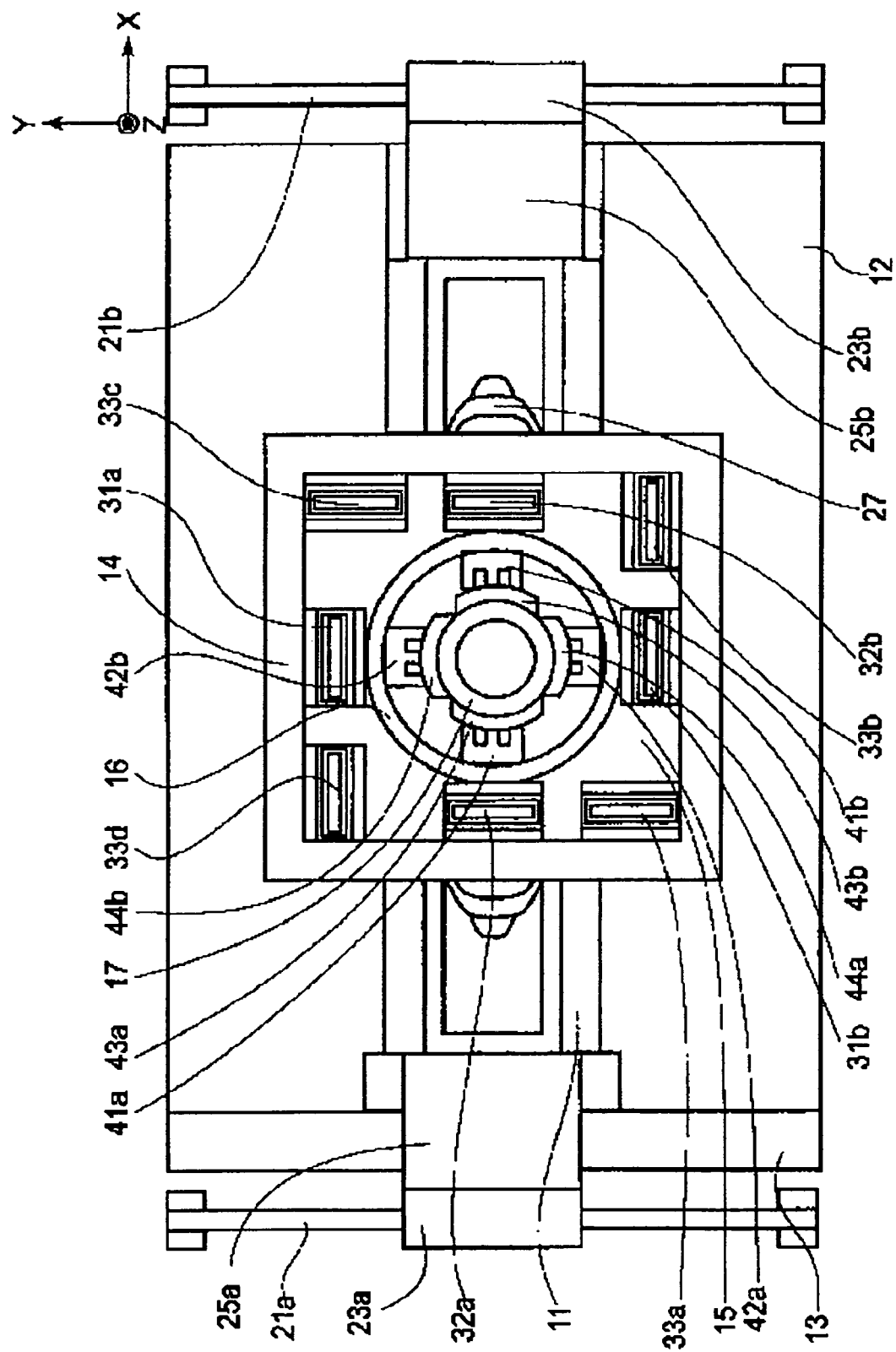
FIG. 2 is a plan view of the stage system of the FIG. 1 embodiment.

FIG. 1 illustrates a wafer stage of an exposure apparatus, and FIG. 2 is a plan view of the apparatus. In recent years, for further improvements in moving speed of the stage, a stage system, wherein a rough-motion stage (11 and 15) and a fine-motion stage (14) are provided separately, such as shown in FIG. 1, is used.

A base table 12 has a mirror-finished top surface, and a guide 13 has a mirror-finished side surface. A Y stage 11 is guided in a Y direction along these surfaces, by means of a static bearing (not shown). An X stage 15 is guided in the X direction along the top surface of the base table 12 and the side surface of the Y stage 11, by means of a static bearing (not shown). The static bearing between the Y stage 11 and the X stage 15 is arranged so as to sandwich the Y stage.

A Y linear motor coil comprises Y linear motor stators 21a and 21b, each being constituted by a coil, as well as Y linear motor movable elements 23a and 23b each being constituted by a magnet. The Y stage 11 is coupled to the Y linear motor by means of Y linear motor connecting plates 25a and 25b. The Y stage 11 can be positioned at a desired position in the Y direction, by means of this Y linear motor and a control system (not shown). Similarly, the X linear motor 27 includes X linear motor stators (not shown) provided on the Y stage 11, as well as X linear motor movable elements (not shown). The X stage 15 can be position-controlled with respect to the X direction, by means of the X linear motor 27 and a control system (not shown).

There is a fine-motion stage 14 mounted on the X stage 15. Provided between the X stage 15 and the fine-motion stage 14 are fine-motion X linear motors 31a and 31b, fine-motion Y linear motors 32a and 32b, and fine-motion Z linear motors 33a, 33b, 33c, and 33d, for producing driving forces in X, Y and Z directions, respectively. By means of these linear motors and a control system (not shown), the fine-motion stage 14 can be controllably positioned with respect to six axes (i.e., the X axis, the Y axis, the Z axis, and rotational directions about these axes). In FIG. 1, illustration of the fine-motion linear motors is partially omitted, for simplicity of the illustration.

The X stage 15 is provided with a measuring system 3 (which may be a laser interferometer, for example) for measuring stage movement amounts in the X and Y directions. The fine-motion stage 14 is provided with a measuring system 4 (which may be a laser interferometer, for example) for measuring the movement amounts of the fine-motion stage 16 in the six-axis directions described above. These measuring systems are used for the positioning control of the stages, respectively. Here, the movement amount of the X stage 15 in the Y direction may be measured by measuring the movement amount of the Y stage.

Furthermore, between the X stage 15 and the fine-motion stage 14, there is a force coupling mechanism (hereinafter, "electromagnetic coupling mechanism") for producing an attraction force on the basis of the function of electromagnets. This mechanism includes E-shaped electromagnets 41a, 41b, 42a and 42b, an E-shaped electromagnet fixing member 16, targets (magnetic material members) 43a, 43b, 44a and 44b, and a target fixing member 17. Here, the E-shaped electromagnets 41a and 41b are electromagnets arranged to produce a force in the X direction, while the electromagnets 42a and 42b are electromagnets arranged to produce a force in the Y direction. The targets 43a and 43b are targets effective to produce a force in the X direction, while the targets 44a and 44b are targets effective to produce a force in the Y direction.

The acceleration and deceleration force of the fine-motion stage 14 during acceleration and deceleration of the fine-motion stages 11 and 15 can be transmitted from the X stage 15 to the fine-motion stage 14 through the electromagnetic coupling mechanism, by feed-forwarding a force (command value) calculated from the acceleration and the mass of the fine-motion stage 14 to the E-shaped electromagnets 41a, 41b, 42a and 42b. With this feed-forwarding of the acceleration and deceleration force through the E-shaped electromagnets 41a, 41b, 42a and 42b, and so on, the fine-motion linear motors 31a, 31b, 32a, 32b, 33a, 33b, 33c and 33d do not need a large force during acceleration and deceleration.

Figure 3:
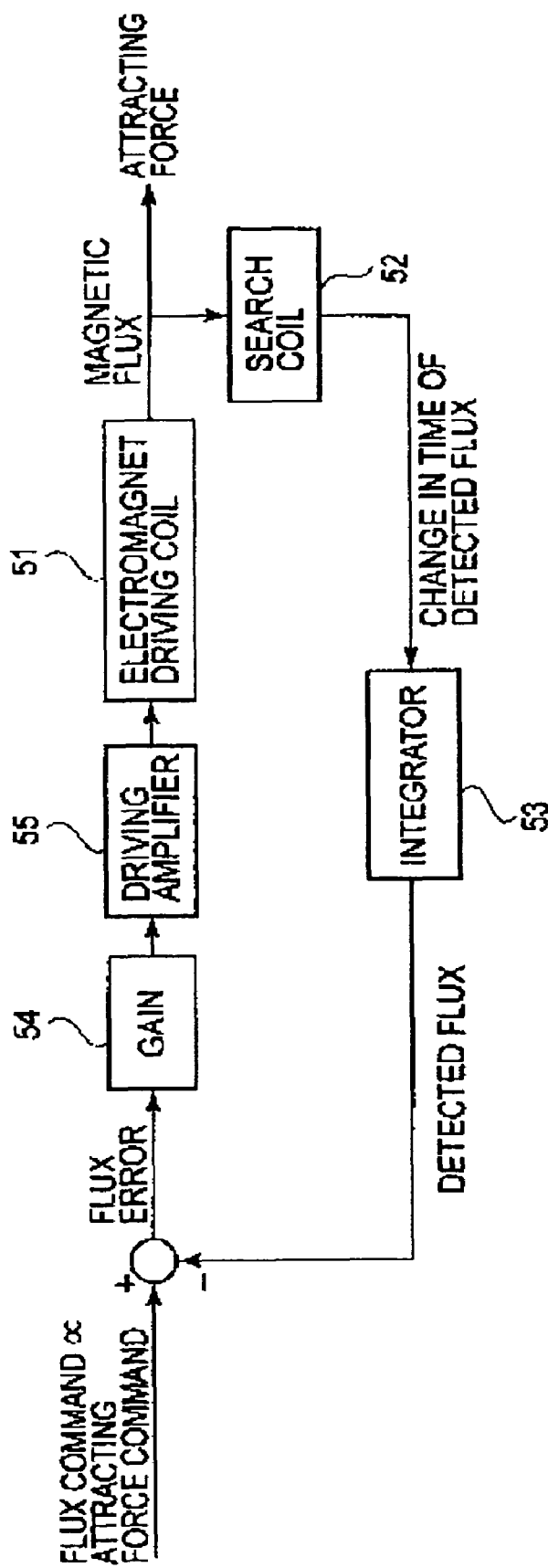
FIG. 3 is a diagrammatic view of a magnetic flux feedback control system for an electromagnetic coupling, which is provided in the stage system of the FIG. 1 embodiment.

The force control of the E-shaped electromagnets 41a, 41b, 42a and 42b described above is based on magnetic flux feedback, such as shown in FIG. 3. In FIG. 3, the electrical current flowing through a driving coil 51 of the E-shaped electromagnet produces a magnetic flux at the electromagnetic coupling, and a force, which is proportional to the square of this magnetic flux, is produced as an attracting force. An induced voltage is measured by using a search coil 52 provided at the E-shaped electromagnetic coupling. This induced voltage corresponds to a change in time of the magnetic flux when the electromagnetic coupling is actuated. The feedback circuit operates to integrate this induced voltage with time, by using an integrator 53, and a difference (magnetic flux error) between the detected magnetic flux and the magnetic flux command, which is proportional to the force command, is calculated. A gain 54 is applied to the obtained difference, and the resultant is outputted to an electromagnetic coupling driving amplifier 55 as a command.

Figure 4:
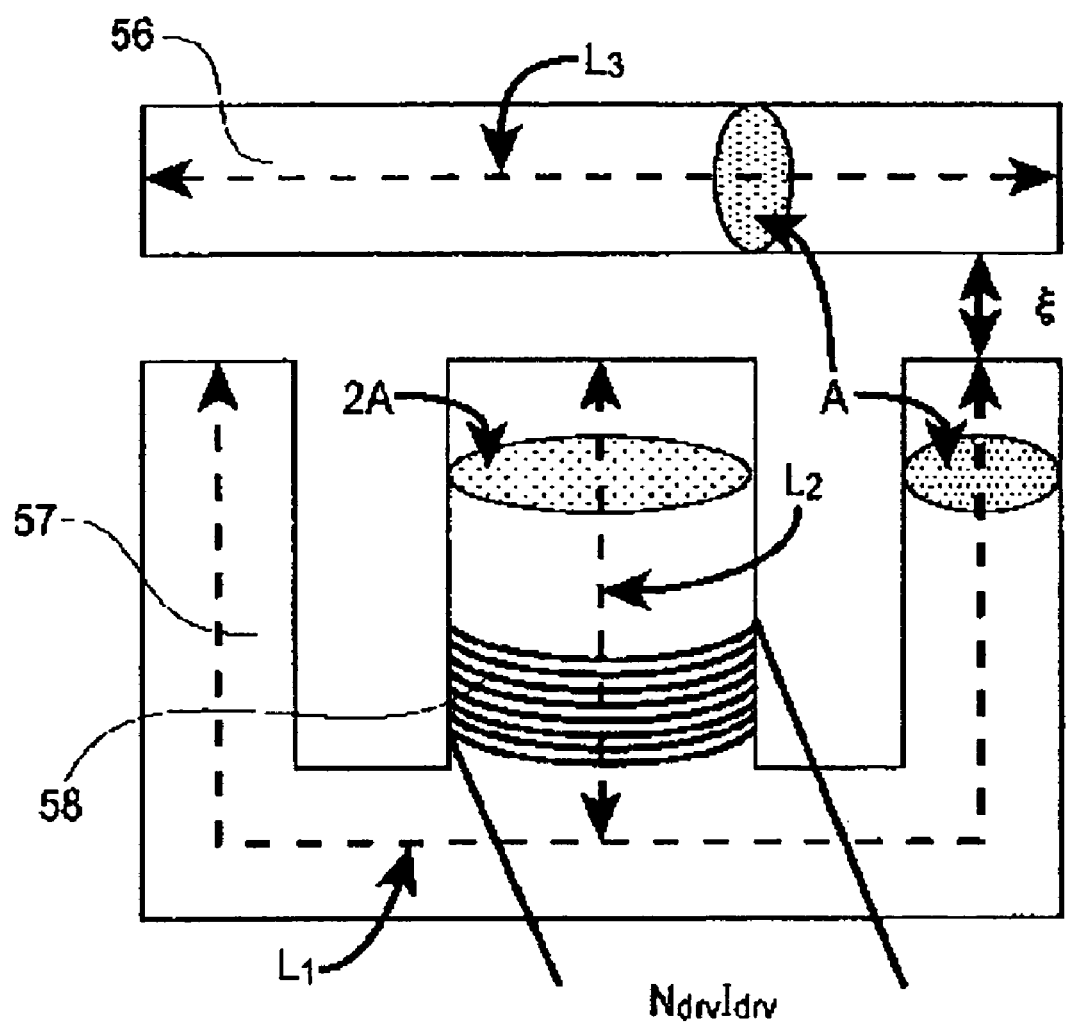
FIG. 4 is a schematic and plan view of an electromagnetic coupling (joint).

A magnetic resistance (reluctance) at an electromagnetic coupling (electromagnet), as schematically shown in FIG. 4, can be expressed by equation (1) below, with a magnetic resistance Rm [AT/Wb] (or [1/H]), a gap ξ[m], a sectional area A [m$^2$], lengths L1, L2 and L3 [m], an absolute permeability of a vacuum μ0 [H/m]=4π*10$^{-7}$, and μ=μ0+μs [H/m] (in the case of ferro silicon, μs=7000).

$$Rm = \frac{2L_1 + L_2 + 2L_3}{2\mu A} + \frac{5\xi}{2\mu A} \quad [AT/Wb] \qquad (1)$$

Although the magnetic resistance Rm is expressed by the sum of magnetic resistances of the magnetic material (first term) and the gap (second term), since the magnetic permeability 11 of the magnetic material is very large, the magnetic resistance of the gap ξ becomes dominant for the resistance. Further, the magnetic resistance $R_m$ can be considered to be a linear function of the gap ξ, taking the first term as an offset. On the other hand, the magnetic flux ø can be expressed by using an electrical current $I_{drv}$ flowing through a driving coil of $N_{drv}$ turns, as well as the magnetic resistance $R_m$, as follows.

$$\phi = N_{drv} * \frac{I_{drv}}{R_m} \quad [Wb] \qquad (2)$$

When the magnetic flux control based on the magnetic flux feedback described above is carried out, the current Idrv as well is controlled in accordance with the change of $R_m$, so that the magnetic flux ø takes a predetermined value. Hence, $$I_{drv} \alpha R_m \qquad (3)$$

is given. Therefore, from equations (1) and (3), it is concluded that the relation between the driving current $I_{drv}$ and the gap ξ is linear. Thus, if the driving current when the gap is zero is denoted by "b", the following relation is obtained.

$$I_{drv} = a * \xi + b \qquad (4)$$

In FIG. 4, denoted at 56 is a target, and denoted at 57 is an E-shaped electromagnet. Denoted at 58 is a driving coil. These correspond to the targets 44a, 44b, 43a and 43b and the E-shaped electromagnets 41a, 41b, 42a and 42b in FIG. 2.

The detection sequence is as follows. The relative center of the rough-motion stage and the fine-motion stage as measured by using an interferometer is taken as an initial position, and either the rough-motion stage or the fine-motion stage is shifted in the X direction from the initial position by a predetermined amount (1st step). Then, the largest amplitude value of the electrical current, which flows through the driving coil (hereinafter, this current will be referred to as "driving current") as the rough motion stage is moved stepwise at the thus shifted position, is measured (second step). Here, in order to assure that a predetermined magnetic force is produced, the stepwise motion is carried out under the same conditions of largest velocity and acceleration, etc. This operation is repeated several times, while changing the amount of shift.

Figure 5A:
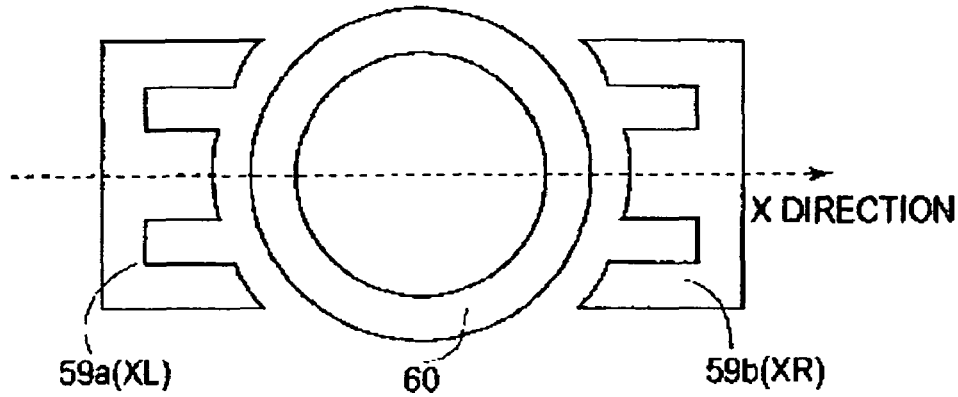
Figure 5B:
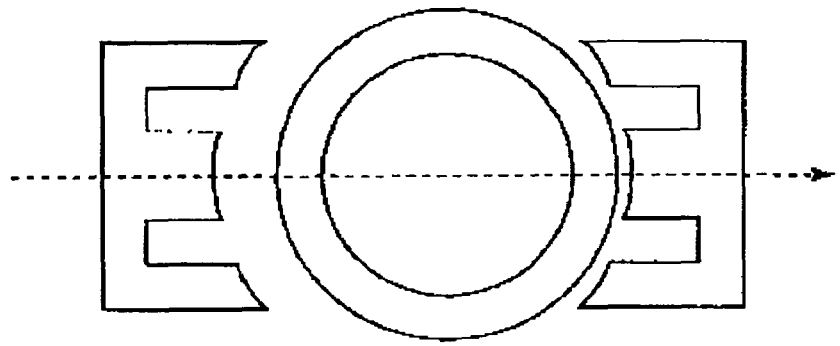
Figure 5C:
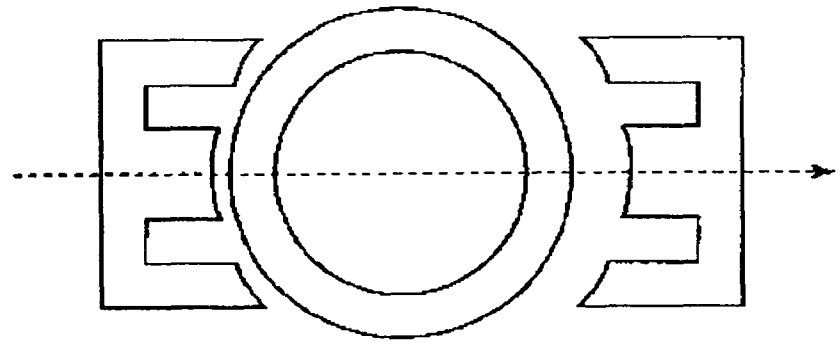

In FIGS. 5A-5C, denoted at 59a is an E-shaped electromagnet at the XL side, and denoted at 59b is an E-shaped electromagnet at the XR side. Denoted at 60 is a target. These correspond to the targets 44a, 44b, 43a and 43b and the E-shaped electromagnets 41a, 41b, 42a and 42b in FIG. 2.

Figure 6A:
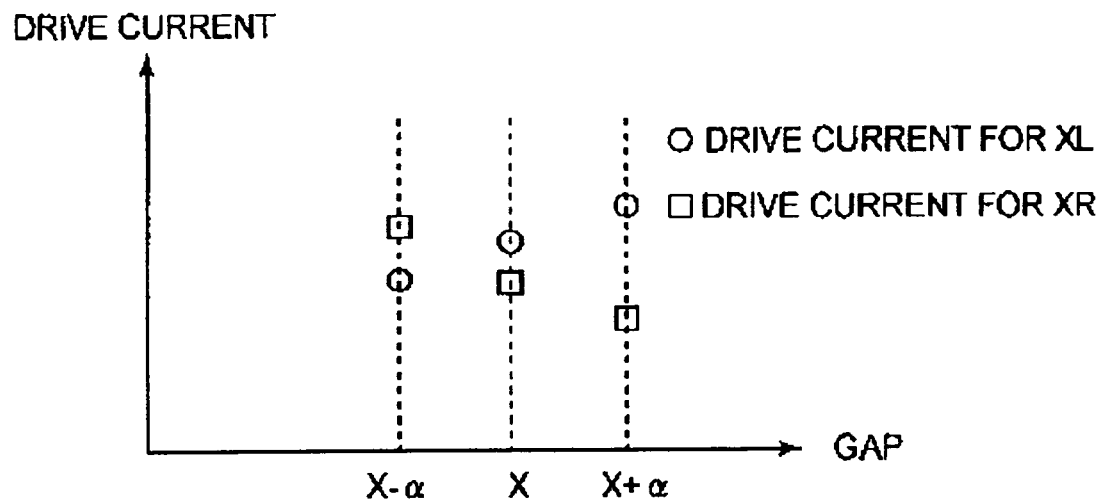
FIG. 6A is a graph showing driving electrical current values of E-shaped electromagnets XL and XR in FIGS. 5A-5C at respective gap magnitudes.
Figure 6B:
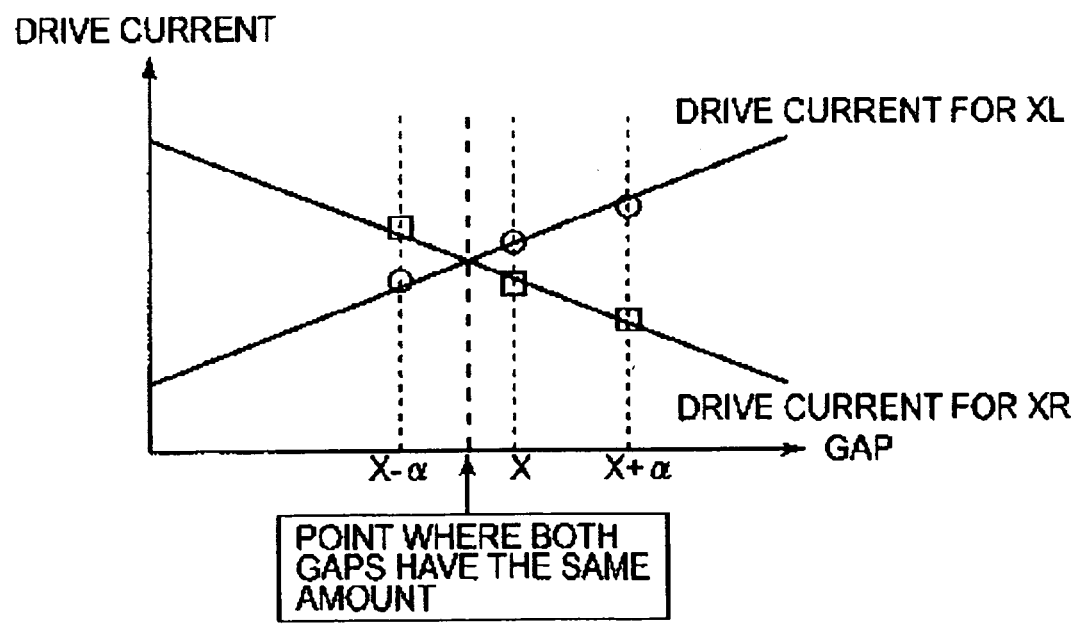
FIG. 6B is a graph showing the results of approximating the electrical current values of FIG. 6A by a linear function, and illustrating that the point of intersection between the driving currents corresponding to the gaps of XL and XR is at the point where the gaps have the same magnitude.

As shown in FIGS. 5A-5C, if the fine-motion stage is shifted in the positive direction from the initial position X, the clearance at the XR side is narrowed (the driving current value is lowered), while the clearance at the XL side is widened (the driving current value is raised) (FIG. 5B). If the stage is shifted in the negative direction, the result is reversed (FIG. 5C). From the measured values of them (FIG. 6A), approximation is carried out as in equation (4) in accordance with the least square method, for example. Then, the point of intersection of driving currents of the opposed electromagnetic couplings is carried out (FIG. 6B) (3rd step). It is seen that this point of intersection is the very point where the gaps have the same size. The distance from the current position of the fine-motion stage to the center is calculated, and the stage is moved to there (4th step). This operation may be carried out before a start of a scan (before stage driving) and/or during the idling state, by which the movable member can be placed to maintain the gaps of the same magnitude.

Figure 7:
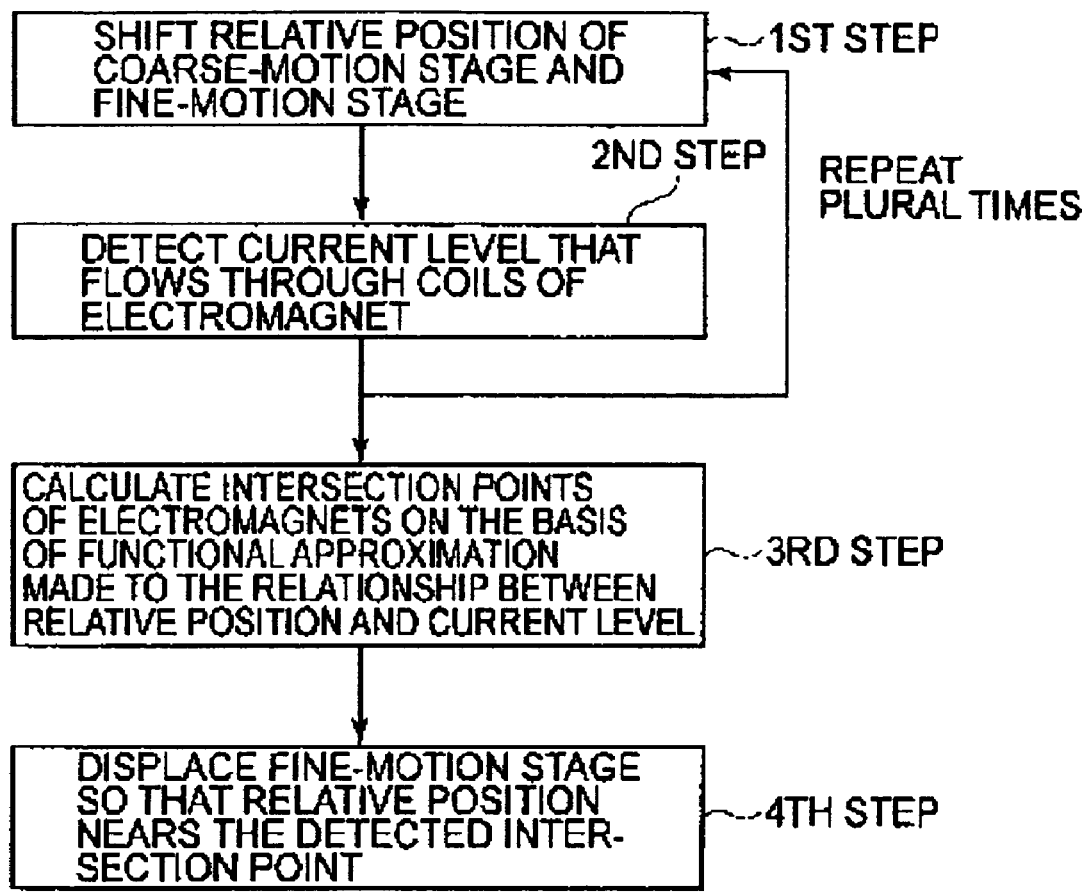
FIG. 7 is a flow chart for explaining the gap registering operation in the stage system of the FIG. 1 embodiment.

FIG. 7 is a flow chart for explaining the procedure described above.

Embodiment 2

The present invention is applicable not only to a positioning system, but also, to a magnetic bearing device. The second embodiment is an example wherein the invention is applied to a magnetic bearing device. Here, explanation of the structural portion similar to that of the first embodiment will be omitted.

Figure 8:
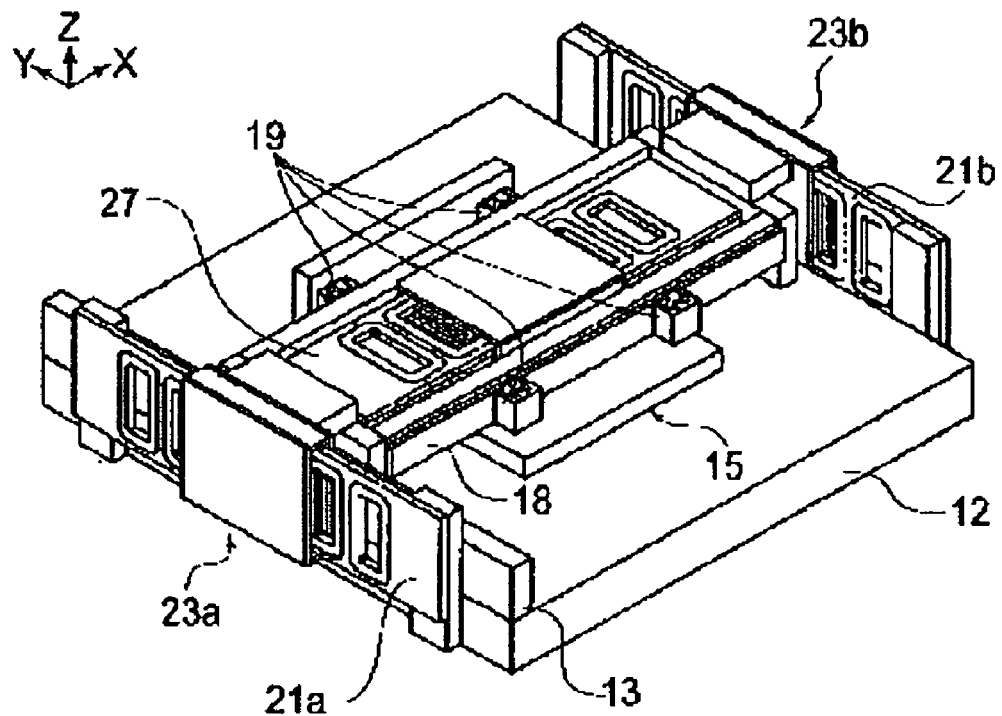
FIG. 8 is a perspective view of a magnetic bearing device according to a second embodiment of the present invention.

FIG. 8 is a perspective view of a Y stage 11 and an X stage 15, such as shown in FIG. 1. In FIG. 8, the Y stage 11 has magnetic material plates 18, and the X stage 15 has four electromagnets 19.

Figure 9:
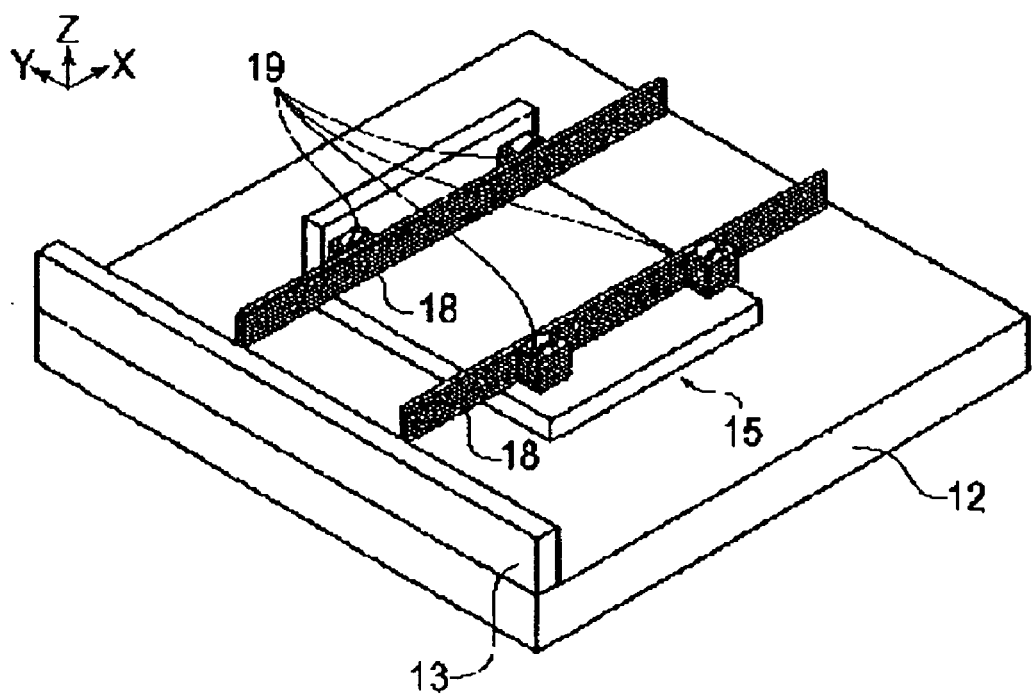
FIG. 9 is a perspective view wherein a Y stage in the FIG. 8 embodiment is removed for a better understanding of the structure of the magnetic bearing device.

FIG. 9 clearly illustrates the relation between the magnetic material plates 18 and the electromagnets 19 of FIG. 8.

As seen in FIGS. 8 and 9, the X stage 15 is guided to be moved along the side surface of the Y stage 11, by means of the four electromagnets and two magnetic material plates 18, provided between the side surface of the Y stage 11 and the side plate of the X stage 15. The two magnetic material plates 18 are fixed to the side surfaces of the Y stage 11, respectively, and the four electromagnets are fixed to the two side plates of the X stage (each pair of electromagnets being fixed to one side plate). The magnetic material plate 18, and corresponding two electromagnets, are disposed opposed to each other, without contact to each other.

Even in a case wherein electromagnets are used as a magnetic bearing, as in this example, any difference in clearance between the magnetic material member and each of opposed electromagnets can be reduced similarly, as in the first embodiment.

Embodiment 3

Figure 10:
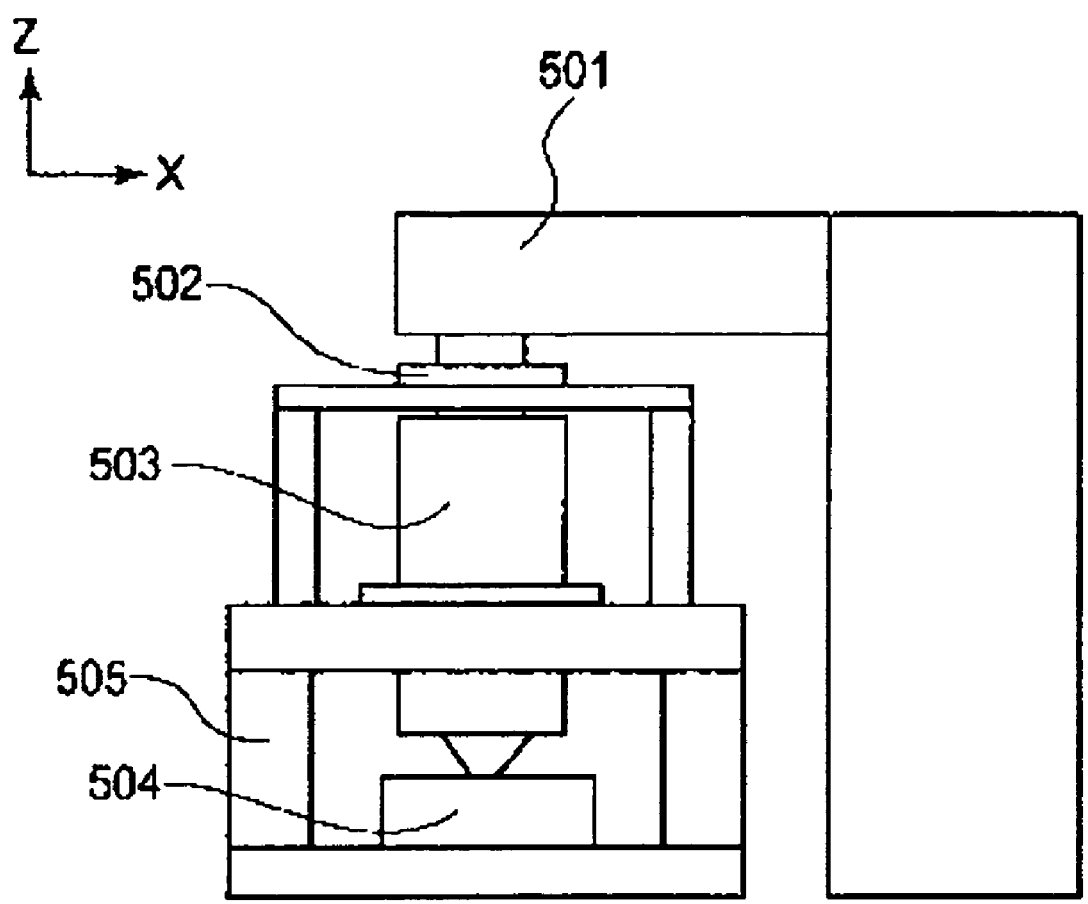
FIG. 10 is a schematic view of an exposure apparatus according to a third embodiment of the present invention.

FIG. 10 shows an exposure apparatus for device manufacture, having a positioning system such as described hereinbefore as a wafer stage or a reticle stage.

This exposure apparatus can be used for the manufacture of microdevices having a fine pattern formed thereon, such as semiconductor devices (semiconductor integrated circuits, for example), micromachines, or thin-film magnetic heads, for example. In this exposure apparatus, exposure light (which may include visible light, ultraviolet light, EUV light, X-rays, an electron beam, and a charged particle beam, for example), as exposure energy supplied from an illumination system unit 501, is projected onto a semiconductor wafer (substrate) W through a reticle (original), by means of a projection lens 503 (which may include a refractive lens, a reflective lens, a catadioptric lens system, and a charged particle lens, for example), whereby a desired pattern is produced on the substrate, which is placed on a wafer stage 504. In such an exposure apparatus, as the wavelength of exposure light used is shortened, an exposure operation has to be carried out in a vacuum ambience.

A wafer (substrate) W is held on a chuck, which is mounted on the wafer stage 504, and a pattern of the reticle R (original) mounted on a reticle stage 502 is transferred in a reduced scale onto different regions on the wafer W by means of the illumination system unit 501, in accordance with a step-and-repeat method or a step-and-scan method.

It should be noted that the stage system of the first embodiment can be used as the wafer stage 504 or the reticle stage 502.

Embodiment 4

Next, an embodiment of a microdevice manufacturing method, which uses an exposure apparatus of the third embodiment described above, will be explained.

Figure 11:
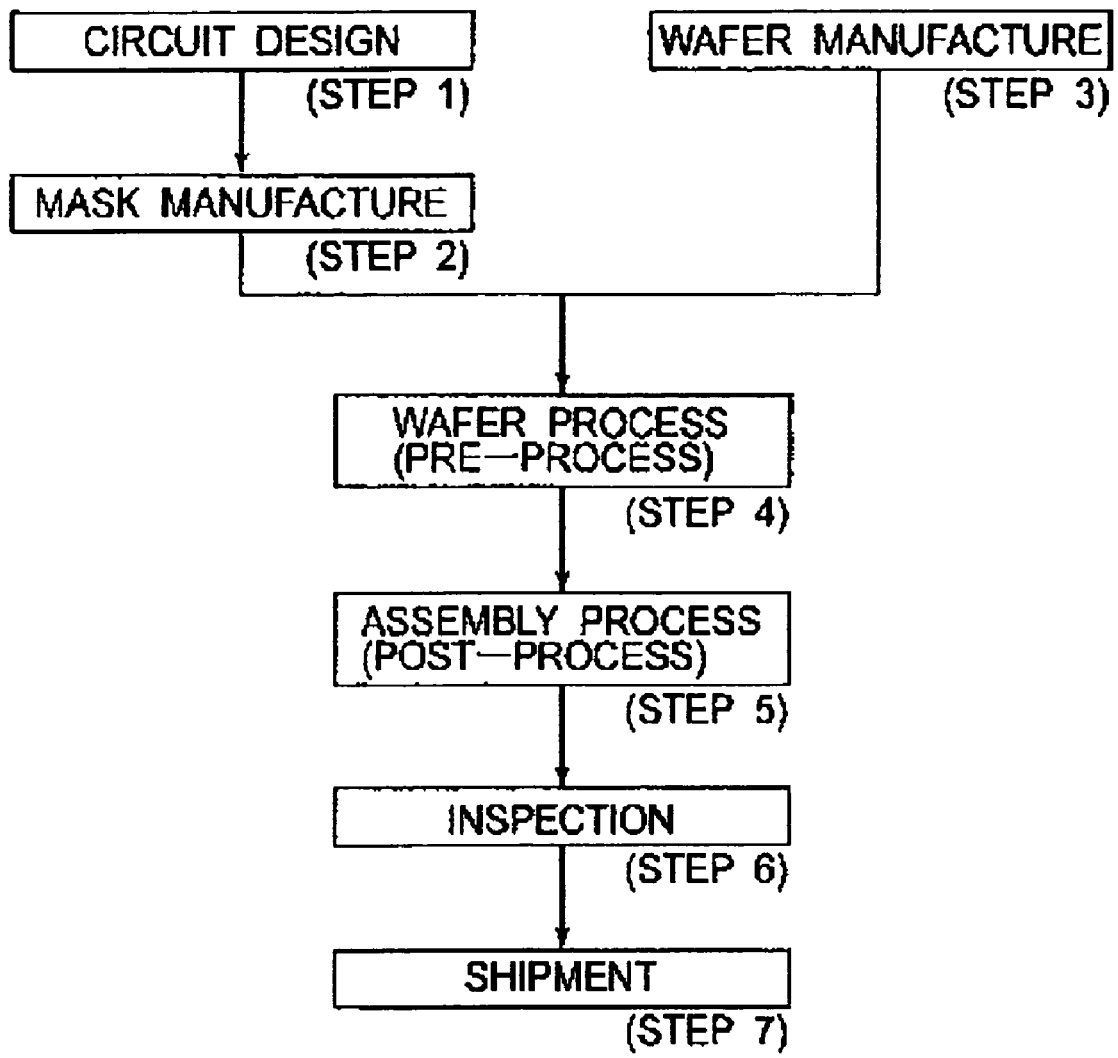
FIG. 11 is a flow chart for explaining sequential operations of device manufacturing processes.

FIG. 11 is a flow chart for explaining the overall procedure for the production of microdevices, such as semiconductor chips (ICs or LSIs), liquid crystal panels, CCDs, thin film magnetic heads, micromachines, etc.

Step 1 is a design process for designing a circuit of a semiconductor device. Step 2 is a process for making a mask on the basis of the circuit pattern design.

On the other hand, Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5, subsequent to this, is an assembling step, which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check, and so on, for the semiconductor devices produced by step 5, are carried out. With these processes, semiconductor devices are produced, and finally, they are shipped (step 7).

More specifically, the wafer process at step 4 described above includes (i) an oxidation process for oxidizing the surface of a wafer, (ii) a CVD process for forming an insulating film on the wafer surface, (iii) an electrode forming process for forming electrodes upon the wafer by vapor deposition, (iv) an ion implanting process for implanting ions to the wafer, (v) a resist process for applying a resist (photosensitive material) to the wafer, (vi) an exposure process for printing, by exposure, the circuit pattern of the mask on the wafer through the exposure apparatus described above, (vii) a developing process for developing the exposed wafer, (viii) an etching process for removing portions other than the developed resist image, and (ix) a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A stage system, comprising:
a stage which is going to be positioned;
a magnetic material member provided on said stage;
electromagnets disposed at opposite sides of said magnetic material member;
a detector for detecting an electrical current value of a coil, which is a component of said electromagnets; and
a position detector for detecting a position of said stage, wherein a center position of said magnetic material member between said electromagnets is determined on the basis of a relation between the position of said stage and the electrical current value of said coil, as said magnetic material member is moved relative to said electromagnets.

2. A stage system according to claim 1, further comprising a second stage being movable while carrying the first-mentioned stage thereon, wherein said electromagnets are provided on said second stage.

3. A stage system according to claim 2, wherein said electromagnets are operable to transmit a forces related to acceleration or deceleration of said second stage, to the first-mentioned stage.

4. A stage system according to claim 2, further comprising an actuator for driving said second stage relative to the first-mentioned stage.

5. An exposure apparatus for exposing a substrate to a pattern, said apparatus comprising:
a stage system, as recited in claim 1, for positioning the substrate.

6. An apparatus, comprising:
a first member;
a second member;
a magnetic material member provided on said first member;

electromagnets provided on said second member and being disposed at opposite sides of said magnetic material member;

a detector for detecting an electrical current value of a coil, which is a component of said electromagnets; and a position detector for detecting a position of at least one of said first member and said second member, wherein a center position of said magnetic material member between said electromagnets is determined on the basis of a relation between the position detected by said position detector and the electrical current value of said coils as said magnetic material member is moved relative to said electromagnets.

7. An apparatus according to claim 6, wherein said first member is adapted to guide said second member.

8. A method of controlling an apparatus having a magnetic material member being provided on a first member, and electromagnets provided on a second member and being disposed at opposite sides of the magnetic material member, said method comprising the steps of:

changing a relative position of the first and second members;

detecting the relative position of the first and second members;

detecting an electrical current value of a coil, which is a component of the electromagnets; and determining a center position of the magnetic material member between the electromagnets, on the basis of a relation between the relative position and the electrical current value.

* * * * *

UNITED STATES PATENT AND TRADEMARK OFFICE
CERTIFICATE OF CORRECTION

PATENT NO. : 7,385,318 B2 Page 1 of 1
APPLICATION NO. : 11/282713
DATED : June 10, 2008
INVENTOR(S) : Yoshihiro Hirata It is certified that error appears in the above-identified patent and that said Letters Patent is hereby corrected as shown below:

COLUMN 5:
　　　Line 45, "ability 11" should read -- ability µ --.

COLUMN 8:
　　　Line 8, "forces" should read -- force, --.

COLUMN 9:
　　　Line 11, "coils" should read -- coil, --.

Signed and Sealed this

Twentieth Day of January, 2009

JON W. DUDAS
*Director of the United States Patent and Trademark Office*